United States Patent [19]
Masuda et al.

[11] Patent Number: 5,607,780
[45] Date of Patent: Mar. 4, 1997

[54] TARGET FOR MAGNETO-OPTICAL RECORDING MEDIUM AND PROCESS FOR PRODUCTION THEREOF

[75] Inventors: Kaoru Masuda, Yasugi; Takashi Meguro, Yonago, both of Japan

[73] Assignee: Hitachi Metals, Ltd., Tokyo, Japan

[21] Appl. No.: 246,825

[22] Filed: May 20, 1994

[30] Foreign Application Priority Data

Jul. 30, 1993 [JP] Japan ................................. 5-208507
Mar. 1, 1994 [JP] Japan ................................. 6-055248

[51] Int. Cl.$^6$ ........................... G11B 5/66; B22F 9/00
[52] U.S. Cl. ................... 428/694 ML; 428/692; 428/694 SC; 428/694 LE; 420/416; 419/33; 419/48; 419/57; 419/60; 75/319; 75/245; 75/246; 75/255; 75/348; 75/351
[58] Field of Search ..................... 420/416; 428/692, 428/694 ML, 694 SC, 694 LE; 75/319, 245, 246, 255, 348, 351; 419/33, 48, 57, 60

[56] References Cited

U.S. PATENT DOCUMENTS

| | | | |
|---|---|---|---|
| 4,620,872 | 11/1986 | Hijikata et al. | 75/246 |
| 4,824,481 | 4/1989 | Chatterjee et al. | 75/246 |
| 4,957,549 | 11/1990 | Matsumoto et al. | 75/246 |

FOREIGN PATENT DOCUMENTS

| | | | |
|---|---|---|---|
| 95788 | 5/1986 | Japan. | |
| 274033 | 11/1987 | Japan. | |
| 50469 | 3/1988 | Japan. | |
| 143255 | 6/1988 | Japan. | |
| 8243 | 1/1989 | Japan. | |
| 6425977 | 1/1989 | Japan | C23C 14/34 |
| 108367 | 4/1989 | Japan. | |
| 142043 | 6/1989 | Japan. | |
| 242733 | 9/1989 | Japan. | |
| 1247571 | 10/1989 | Japan | C23C 14/34 |
| 138463 | 5/1990 | Japan. | |
| 267260 | 11/1990 | Japan. | |
| 4365860 | 12/1992 | Japan | C23C 14/34 |
| 5271915 | 10/1993 | Japan | C23C 14/34 |
| 2131 | 1/1994 | Japan. | |
| 320896 | 3/1994 | Japan. | |

*Primary Examiner*—Leszek Kiliman
*Attorney, Agent, or Firm*—Sughrue, Mion, Zinn, Macpeak & Seas

[57] ABSTRACT

Disclosed are a target material for magneto-optical recording medium having a structure formed by sintering of an RE-TM phase (A) having a composition with an RE content higher than that of the composition of an intermetallic compound represented by the chemical formula $TM_2RE$, and a TM-RE phase (B) having a composition with an RE content equal to or lower than that of the composition of an intermetallic compound represented by the chemical formula $TM_2E$, wherein RE denotes at least one rare earth element selected from the group of elements consisting of Nd, Gd, Tb, Dy, Ho and Er, and TM denotes at least one element selected from the group of metals of the iron group which consists of Fe, Co and Ni; and a process for producing the same.

22 Claims, 5 Drawing Sheets

- Cr
- TM-RE PHASE (B)
- TM-RE PHASE (C)
- RE-TM PHASE (A)

FIG. 4

- RE-TM PHASE (A)
- TM-RE PHASE (B)
- Fe-Cr
- Co-Cr (C')

TARGET FOR MAGNETO-OPTICAL RECORDING MEDIUM AND PROCESS FOR PRODUCTION THEREOF

BACKGROUND OF THE INVENTION

The present invention relates to a target material for magneto-optical recording medium having a low magnetic permeability which is suitable particularly for magnetron sputtering, and a process for producing the target material.

Magneto-optical recording media have come to be used as rewritable recording media with a large capacity in storage devices of computers or for filing of imagerial informations. They have come to be used also as small-sized recording media called "minidisc" for music or data recording.

In these magneto-optical recording media, the magneto-optical characteristics of an amorphous thin film composed mainly of a rare earth element and an element of the iron group are usually utilized.

The thin film used for magneto-optical recording media is usually prepared by sputtering deposition.

There are various methods for the sputtering, for example, a method of sputtering simple substances of a rare earth element and an element of the iron group, respectively, at the same time as separate targets (co-sputtering method); and a method of sputtering a target previously obtained by alloying or compositing an element which is desired to be formed into a thin film.

Of such targets, the composite type targets for magneto-optical recording medium disclosed in Japanese Patent Laid-Open Nos. 62-70550 and 1-25977, i.e., the targets comprising a rare-earth element containing phase composed mainly of a rare earth element and/or an intermetallic compound or alloy of a rare earth element and an element of the iron group, and a metallic phase composed mainly of an element of the iron group, have come to be widely used because they are advantageous in that the component distribution in a film can be made uniform by microstructure control of the target, as compared with the compound type target disclosed in Japanese Patent Laid-Open No. 1-149959.

Since a rare earth element contained in a target is very active, one or more additive elements are often added for improving the corrosion resistance of a thin film. For example, Japanese Patent Laid-Open No. 1-247571 reports a method for improving the corrosion resistance of a thin film by using a target material containing 15% by atom or less of at least one additive element selected from the group consisting of Ti, Al, Cu, Cr, Nb, Ta, Pd and Pt.

Of the above-mentioned sputtering methods, magnetron sputtering suitable for increasing deposition rate has recently become a leading method. This magnetron sputtering comprises generating a leakage magnetic flux on the surface of a target material to confine a plasma near the surface of the target material.

However, the above-mentioned composite type target disclosed in Japanese Patent Laid-Open No. 1-25977 contains ferromagnetic phases such as Fe and Co, resulting in high saturation magnetic flux density (high Bs) of a target material and hence a high magnetic permeability thereof. Therefore, an insufficient leakage is generated from the surface of the target material, resulting in problems such as a lowered film-forming efficiency and a lowered use efficiency of the target material due to a progress of formation of local convexities.

Accordingly, there is eagerly desired a target material for magneto-optical recording medium having a low magnetic permeability.

As a target material for magneto-optical recording medium which can have a reduced magnetic permeability and is suitable for magnetron sputtering, there has recently been reported in Japanese Patent Laid-Open No. 4-365860 a target having a structure comprising a composite phase composed of a crystallized metal of the iron group finely and uniformly dispersed in a matrix made of an intermetallic compound of a rare earth metal and a metal of the iron group (hereinafter referred to merely as "intermetallic compound"), a rare-earth metal phase, and an intermetallic compound phase composed of a reaction phase of the aforesaid composite phase with the aforesaid rare earth metal phase.

The target disclosed in Japanese Patent Laid-Open No. 4-365860 has a reduced magnetic permeability by virtue of the composite phase composed of a crystallized metal of the iron group finely dispersed in an intermetallic compound.

The target disclosed in Japanese Patent Laid-Open No. 4-365860 is effective in reducing the magnetic permeability but has the following defect. Since the target has the rare-earth metal phase as a pure rare-earth metal phase and the intermetallic compound phase formed by heat treatment, its structure is coarse. Therefore, the difference in angle of sputtered atoms between the rare earth metal and the intermetallic compound in sputtering affects the component distribution in a film formed, so that it is difficult to make the component distribution in the film uniform.

Said target is disadvantageous also in that because of the coarse structure, a pre-sputtering time, i.e., a time required for the composition of the film to attain equilibrium in early sputtering, is long.

The magnetic characteristics of an amorphous magnetic thin film with perpendicular magnetization composed mainly of a rare earth element and a metal of the iron group which is used as a magneto-optical recording film, are very sensitive to the composition of the film. In particular, only a slight change of the content of the rare earth element in the film causes drastic changes of coercive force and Kerr rotation angle. Therefore, in order to assure stable magnetic characteristics of a magneto-optical recording film, a target material capable of giving a uniform rare-earth element distribution in the film in a wide film formation area is desired when a magnetic layer is formed by sputtering.

SUMMARY OF THE INVENTION

An object of the present invention is to provide a target material for magneto-optical recording medium which has a low magnetic permeability, can achieve a uniform component distribution in a film, and is suitable particularly for magnetron sputtering; and a process for producing said target material.

The present inventors found that the means described below are effective in reducing the non-uniformity of the distribution of a rare earth element in a film due to the difference in angle of sputtered atoms between a simple-substance phase of the rare earth element and an intermetallic-compound phase at the time of sputtering, and reducing the magnetic permeability.

1. The rare earth element is made present in the form of not a simple-substance phase but an RE-TM phase (the symbols RE and TM are defined below), i.e., a dispersed phase composed of the rare earth element and the intermetallic compound which are present in a dispersed state.

2. In case of the RE-TM phase alone, the metal of the iron group tends to be short for practical of composition used as magneto-optical recording film, and hence is required to be added. For this purpose, there is added the metal of the iron group in the form of not a simple substance but an intermetallic compound or alloy of the metal of the iron group and the rare earth element wherein the metal of the iron group content is higher than in the RE-TM phase.

The present invention was made on the basis of the above finding and provides a target material for magneto-optical recording medium having a structure formed by sintering of an RE-TM phase (A) having a composition with an RE content higher than that of the composition of an intermetallic compound represented by the chemical formula $TM_2RE$, and a TM-RE phase (B) having a composition with an RE content equal to or lower than that of the composition of an intermetallic compound represented by the chemical formula $TM_2RE$, wherein RE denotes at least one rare earth element selected from the group of elements consisting of Nd, Gd, Tb, Dy, Ho and Er, and TM denotes at least one element selected from the group of metals of the iron group which consists of Fe, Co and Ni. Said target material preferably has a structure in which RE and the inter-metallic compound of RE and TM are dispersed, in the RE-TM phase (A).

DETAILED DESCRIPTION OF THE INVENTION

In the present invention, a TM phase may be present in the target material in addition to the above-mentioned components. The reason is as follows. It is preferable that a TM phase, a ferromagnetic material, is not present. But, in some cases, Co is added for adjusting Curie temperature, or TM is added as a simple substance for slight adjustment of the composition.

The proportion of the TM phase in a sputtering surface of the target is preferably 20% by area.

When the target material has such a structure, it has a maximum magnetic permeability of 10 or less or a saturation magnetic flux density (Bs) of 0.8 T or less and is suitable for magnetron sputtering.

In the case of using Fe among the metals of the iron group, when a previously produced eutectic alloy phase of RE and Fe having an RE content of 66 wt % or more is used as the RE-TM phase (A), the eutectic alloy phase becomes a dispersed phase formed by very uniform dispersion of the rare earth element. Therefore, the uniformity of the composition in a film can be further increased.

When the composition of the TM-RE phase (B) for making up the shortage of the metal(s) of the iron group due to the presence thereof only in the RE-TM phase has a lower RE content than does the composition of an intermetallic compound represented by the chemical formula $TM_{17}RE_2$, the TM-RE phase (B) contains α-TM dispersed therein. Consequently, the TM-RE phase (B) becomes a homogeneous and fine crystallized structure composed of α-TM and an intermetallic compound, which is preferable for increasing the uniformity of the composition of a film.

In Japanese Patent Laid-Open No. 1-247571, at least one element X is selected from the group consisting of corrosion-resistant Al, Ti, Cu, Cr, Nb, Ta, Pd and Pt. As described in this reference, they are elements having the same effect of improving the corrosion resistance of a target material. The presence of the metal element(s) X in a target in an amount of 10 wt % or less can improve the corrosion resistance.

When Co is made present as a TM phase (C), it is preferable to make Co present not in the form of a phase composed of Co alone or an alloy phase of metals of the iron group but in the form of a phase composed of 50% by atom or less of at least one element selected from the elements in groups 4A, 5A and 6A of the periodic table and substantially the balance of Co.

When Co is present in the form of an alloy with at least one element selected from the elements in groups 4A, 5A and 6A, i.e., Ti, Zr, Hf, V, Nb, Ta, Cr, Mo and W, magnetization is markedly reduced by strongly perturbing effect, so that the magnetic permeability can be reduced.

Fe is often incorporated into a target for magneto-optical recording medium in addition to Co, but even when one or more elements selected from the elements in groups 4A, 5A and 6A are added to Fe, Fe is not so effective as Co in reducing the saturation magnetic flux density and magnetic permeability of the target.

Alloying Co with Fe is not desirable because it increases the saturation magnetic flux density and magnetic permeability of the target.

Therefore, the presence of a phase composed of 50% by atom or less of at least one element selected from the elements in groups 4A, 5A and 6A of the periodic table and substantially the balance of Co is an effective means for reducing the magnetic permeability of the target.

Particularly in the case of a Co—Cr system and a Co—V system which are typical strongly perturbed systems, it was confirmed that the addition of a slight amount of Cr or V reduces magnetization rapidly and that the systems become nonmagnetic at a Cr or V content of about 25% by atom at room temperature.

On the other hand, the addition of Cr in an amount of about 90% by atom is required for making a Fe—Cr system nonmagnetic.

The reason why the amount of the additive element(s) is limited to 50% by atom or less in the present invention is that the decrease of magnetization is dependent on the percentage by atom of the additive element(s) and that the addition of the additive element(s) in an amount of more than 50% by atom is not very effective in further reducing the magnetic permeability.

The above-mentioned target of the present invention can be obtained by a process for producing a target material for magneto-optical recording medium which comprises sintering, under pressure, powder (a) having a composition with an RE content higher than that of the composition of an intermetallic compound represented by the chemical formula $TM_2RE$, and a structure in which RE and an intermetallic compound of RE and TM are dispersed, and powder (b) having a composition with an RE content equal to or lower than that of the composition of an intermetallic compound represented by the chemical formula $TM_2RE$.

In this case, powder (c) of TM simple substance or an alloy of TM elements and the aforesaid powders (a) and (b) may be mixed and then sintered under pressure.

The powders (a), (b) and (c) are obtained preferably by a rapid solidification process, an ingot grinding process or the like. When the powders (a) and (b) are produced by a rapid solidification process such as an atomization process, these starting powders individually contain a fine dispersed structure and are effective in making the component distribution in a film uniform.

The sintering may be carried out after adding at least one metal element X selected from the group consisting of Al, Ti, Cr, Cu, Nb, Ta, Pd and Pt, in the form of either simple-substance powder or powder of alloy with a rare earth element or a metal of the iron group, in an amount of 10 wt % or less.

In the present invention, when an alloy phase composed of 50% by atom or less of at least one element selected from the elements in groups 4A, 5A and 6A of the periodic table and substantially the balance of Co is made present, it is sufficient that powder having the same composition as that of the alloy phase is sintered.

The reasons for the specifications in the present invention are described below in further detail.

One of the most marked characteristics of the present invention is that as described above, there is hardened, by sintering, an RE-TM phase (A) having a composition with an RE content higher than that of the composition of an intermetallic compound represented by the chemical formula $TM_2RE$, and optionally a structure in which α-RE and an intermetallic compound of RE and TM are dispersed.

The presence of a rare earth element in the target in the form of not a simple-substance phase of the rare earth element but a dispersed phase of an intermetallic compound can reduce the nonuniformity of the composition of a film due to the difference in angle of sputtered atoms between the rare earth element and the intermetallic compound at the time of sputtering.

Since TM necessary for the target is present in a dispersed state in the RE-TM phase (A) in the form of not TM simple substance but the intermetallic compound, there can be attained a magnetic permeability lower than that attained when the whole of TM is present as a simple substance.

In addition, since the RE-TM phase (A) formed by dispersion of TM is less oxidizable than pure RE, the oxygen content of a sintered product can be reduced.

Furthermore, the composition range of the RE-TM phase (A) specified in the present invention is an essential factor for the following effects: a low melting point is attained, the RE-TM phase (A) acts like a binder for the TM-RE phase, and a target having a sufficiently strength is obtained.

In the present invention, for obtaining these effects, the RE-TM phase (A) is made present preferably in a proportion by area of 30 to 70% based on the area of section of the target.

Figure 7:
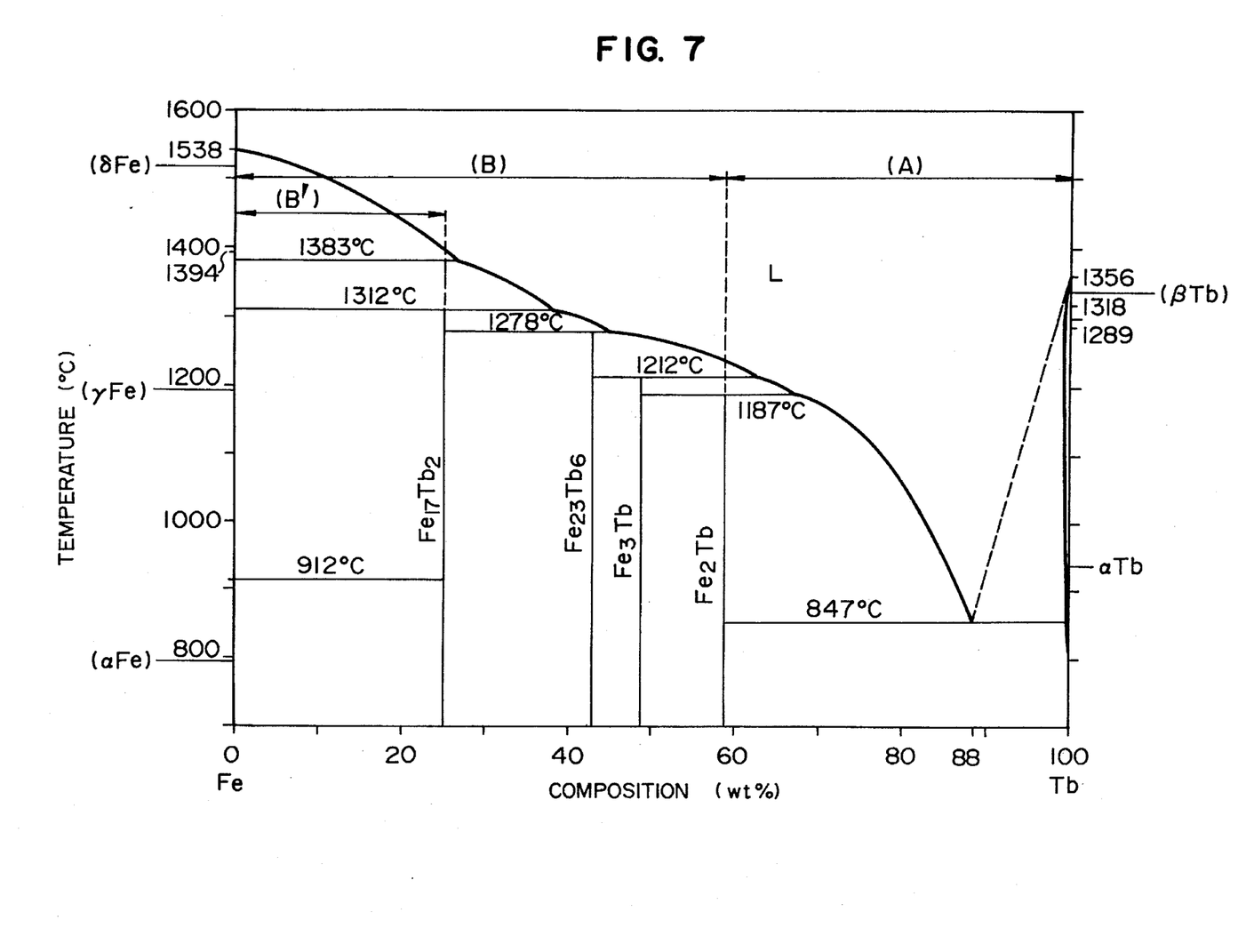
FIG. 7 is a phase diagram of a binary system composed of Tb and Fe.

In the present specification, the passage "a composition with an RE content higher than that of the composition of an intermetallic compound represented by the chemical formula $TM_2RE$" (the RE-TM phase (A)) means, for example, a composition in the range shown by (A) in the phase diagram of a binary system composed of Tb and Fe, typical elements constituting a magneto-optical recording film, which is shown in FIG. 7.

The range (A) shown in FIG. 7 is a composition range in which an eutectic structure is formed. Particularly in a binary system composed of Fe and RE, there is formed an eutectic structure in which an intermetallic compound of the chemical formula $Fe_2RE$ and an α phase of RE are uniformly dispersed.

As starting powder for the RE-TM phase (A) described above, there is preferably used powder having a more uniform and fine eutectic structure which is obtained by a rapid quenching treatment at $10^{2°}$ C./sec or more by gas atomization or the like.

Another marked characteristic of the present invention is that a TM-RE phase (B) having a composition with an RE content equal to or lower than that of the composition of an intermetallic compound represented by the chemical formula $TM_2RE$ is combined with the above-mentioned RE-TM phase (A) by sintering.

As described in Science Forum Co., Ltd. Handbook of Magneto-optical Discs" pp. 61–65, a composition in a composition range wherein an amorphous magnetic thin film with perpendicular magnetization can be obtained as a magneto-optical recording film, usually has an RE content lower than that of $TM_2RE$. Therefore, no target material can be composed of the RE-TM phase (A) alone and the shortage of the metal(s) of the iron group has to be made up.

As described above, since TM is a ferro-magnetic material, the presence of TM as a simple substance increases the saturation magnetization (Ms) of a target material and hence its magnetic permeability. The present inventors ascertained the relationship between structure and magnetic permeability of an intermetallic compound of TM and RE to find that when TM and RE are present in the form of an intermetallic compound or an alloy, the magnetic permeability can be greatly reduced as compared with that attained when each of TM and RE is present as a simple substance.

Accordingly, by making up the shortage of the metal(s) of the iron group by forming the TM-RE phase (B), the magnetic permeability of a target material can be further reduced while maintaining the uniformity of the component distribution in a film which can be attained by the presence of the above-mentioned RE-TM phase (A).

In the present invention, the TM-RE phase (B) is present preferably in a proportion of 30 to 70% by area based on the area of section of the target material.

In the present specification, the passage "a composition with an RE content equal to or lower than that of the composition of an intermetallic compound represented by the chemical formula $TM_2RE$" (the TM-RE phase (B)) means, for example, a composition in the range shown by (B) in FIG. 7, i.e., the phase diagram of a binary system composed of Tb and Fe.

In FIG. 7, in the composition range shown by (B') in the composition range shown by (B), a structure in which an intermetallic compound having a composition $Fe_{17}RE_2$ and α-Fe are dispersed is formed as shown in the phase diagram. When a composition in the range shown by (B') is employed, the TM-RE phase (B) has a high toughness, namely, the brittleness characteristic of intermetallic compounds can be reduced.

Powder used as a material for the TM-RE phase can be produced by a method of grinding a cast ingot or a rapid solidification process such as a gas atomization process.

In the present invention, specific examples of the TM phase optionally added for adjustment of Curie temperature, increase of Kerr rotation angle, and fine adjustment of the composition are pure Fe, pure Co, pure Ni, Fe—Co alloys, Fe—Co—Ni alloys, etc. As described above, when the TM phase is added, its proportion is preferably 20% by area or less based on the area of section of the target material because the TM phase increases the magnetic permeability of the target material.

For the presence of at least one metal element selected from metal elements capable of improving the corrosion resistance (i.e. Al, Ti, Cr, Nb and Ta) in an amount of 10 wt % or less, the metal element(s) may be added in the form of a simple-substance phase or a phase of an alloy with a rare earth element or a metal of the iron group.

In the present invention, as described above, the magnetic permeability can be greatly reduced by strongly perturbing effect by making Co present in the target in the form of an alloy with at least one element selected from the elements in groups 4A, 5A and 6A.

The element(s) in groups 4A, 5A and 6A used in the present invention is effective in reducing the saturation magnetic flux density and magnetic permeability of the target but deteriorates the magneto-optical characteristics of a film. Therefore, for the magneto-optical characteristics, the amount of the element(s) is preferably as small as possible.

On the other hand, of these elements, Cr, Nb, Ta and Ti can be used also as elements capable of imparting corrosion resistance to a film, as described above.

Accordingly, it is preferable to determine the total amount of said element(s) added to the target, depending on required magneto-optical characteristics and corrosion resistance.

In addition, it is preferable to alloy said element(s) with Co and avoid the presence of Co as a phase of a metal simple substance in the target.

As described above, when Cr or V is selected as an element to be alloyed with Co, an alloy obtained by alloying Cr or V in an amount of much more than 25% by atom based on the atoms of Co is nonmagnetic and hence meaningless. Therefore, Cr or V is alloyed with Co in an amount of not much more than 25% by atom as far as possible. When the addition of these elements is necessary for imparting corrosion resistance or the like, it is preferable to reduce the magnetization of another metal phase by alloying said elements with the metal phase. For example, it is preferable to reduce the magnetization of a Fe phase by alloying said elements with Fe.

The above-mentioned target material of the present invention can be obtained by preparing alloy powders corresponding to the above-mentioned phases, and sintering the powders under pressure.

The temperature at the sintering under pressure has to be adjusted to a temperature at which substantially thermally stable presence of the RE-TM phase (A) and the TM-RE phase (B) is possible. This is because when RE-TM phase (A) reacts with the TM-RE phase (B), it forms an intermetallic compound phase to disappear substantially.

The sintering is carried out preferably in a solid-state sintering range in which the sintering temperature is lower than a liquid-phase appearance temperature.

In the present invention, as described above, it is most important that the RE-TM phase (A) and the TM-RE phase (B) have been sintered, and other phases may be present in addition to the two phases.

For example, a rare earth element may be present as a simple substance for adjusting the compositions or the component distribution in a film. The amount of simple substance of the rare earth metal is preferably 5% by area or less based on the area of the sputtering surface of the target because since the simple substance is easily oxidizable, it tends to increase the oxygen content of the target to exert an undesirable influence on the magneto-optical characteristics.

DESCRIPTION OF THE PREFERRED EMBODIMENT

EXAMPLE 1

First, powders having one or two eutectic structures composed of one of various rare earth elements and iron which correspond to each of the compositions of starting powder shown in Table 1 and Table 2, were produced by a gas atomization process as powder (a) for forming an RE-TM phase (A) having a composition with an RE content higher than that of the composition of an intermetallic compound represented by the chemical formula $TM_2RE$, and a structure in which RE and an intermetallic compound of RE and TM are dispersed.

Various powders having each of the compositions of starting powder shown in Table 1 and Table 2 were produced by the same gas atomization process as above, as powder (b) for forming a TM-RE phase (B) having a composition with an RE content equal to or lower than that of the composition of an intermetallic compound represented by the chemical formula $TM_2RE$.

Pure Fe powder, pure Co powder and Fe—Co alloy powder were produced as TM powder (c) for composition adjustment, by the same gas atomization process as above.

The powders (a), (b) and (c) were classified using a sieve (according to the standard of New JIS, 100 meshes, opening <150 μm), whereby starting powders were obtained.

The starting powders were blended so as to give each of the compositions of target material shown in Table 1 and Table 2, and each of the resulting blends was mixed for 6 hours by means of a twin cylinder mixer under an argon atmosphere. The weight of each mixed powder was about 0.85 kg. Then, each mixed powder was packed into a capsule made of soft steel, and heated at a temperature of 400° C. and a degree of vacuum of 0.01 Pa for 4 hours to be degassed. Thereafter, the capsule was sealed and the powder was sintered under pressure by hot isostatic pressing (hereinafter abbreviated as HIP). The HIP conditions were as follows: temperature 665° C., pressure 98 MPa, holding time 2 hours. The sintered product obtained by the HIP treatment was processed into a target material with dimensions of φ125×5 mm by means of a lathe.

The sintered product thus processed was polished, after which its microstructure was observed under an optical microscope and the area ratio among the RE-TM phase (A), the TM-RE phase (B) and the TM phase (C) was measured by image processing.

A 30×10×5 mm square bar was cut out of the processed sintered product as a sample for measuring magnetism, and a B-H curve was obtained by means of a direct-current flux meter at a maximum applied magnetic field of $7.96 \times 10^5$ A/m, whereby the saturation magnetic flux density (Bs) and the maximum relative magnetic permeability (μmax) were determined. The results obtained are shown in Table 1 and Table 2.

It can be seen that all of the target materials for magneto-optical recording medium shown in Table 1 and Table 2 have a saturation magnetic flux density of 0.8 T or less and a maximum magnetic permeability of 10 or less and hence are suitable for magnetron sputtering.

Comparative Example 1

As in Example 1, powders having an eutectic structure composed of one of various rare earth elements and iron which corresponds to each of the compositions of starting powder shown in Table 3, were produced by a gas atomization process as powder (a) for forming an RE-TM phase (A) having a composition with an RE content higher than that in the composition of an intermetallic compound represented by the chemical formula $TM_2RE$, and a structure in which RE and an intermetallic compound of RE and TM are dispersed.

Pure Fe powder and pure Co powder were produced by the same gas atomization process as above, as TM powder (c) constituting a TM phase (C).

The two kinds of the powders, (a) and (c) were classified using a sieve (according to the standard of New JIS, 100 meshes, opening <150 μm), whereby starting powders were obtained.

The starting powders were blended so as to give each of the compositions of target material shown in Table 3. There were obtained, as target materials, samples No. 11 to No. 13 having no TM-RE phase (B) which constituted the target materials of Example 1.

Each of these sintered products was polished, after which as in Example 1, its microstructure was observed under an optical microscope and the area ratio between the RE-TM phase (A) and the TM phase (C) was measured by image processing.

For the sintered products, the saturation magnetic flux density (Bs) and the maximum magnetic permeability (μmax) were determined. The results obtained are shown in Table 3.

As shown in Table 3, samples No. 11 to No. 13 having, as target materials, the same compositions as those of samples No. 1 to No. 3, respectively, shown in Table 1 in Example 1 had a magnetic permeability of more than 10 and hence were not suitable for magnetron sputtering.

EXAMPLE 2

The target materials listed in Table 4 were produced by mixing powder (a) for forming an RE-TM phase (A) and powder (c) for forming a TM simple-substance phase (C) which had been prepared by the same gas atomization process as in Example 1, powder (b) for forming a TM-RE phase (B) which had been obtained by grinding a cast ingot, and an additive element X for improving the corrosion resistance (Al, Ti, Cr, Nb or Ta). Table 4 shows the results of measuring the area ratio among the phases constituting the microstructure of each of the sintered products thus obtained, its saturation magnetic flux density (Bs) and its maximum magnetic permeability (μmax). From the results shown in Table 4, it could be confirmed that the magnetic permeability and the saturation magnetic flux density can be adjusted to 10 or less and 0.8 T or less, respectively, even when the additive element X is present.

Figure 1:
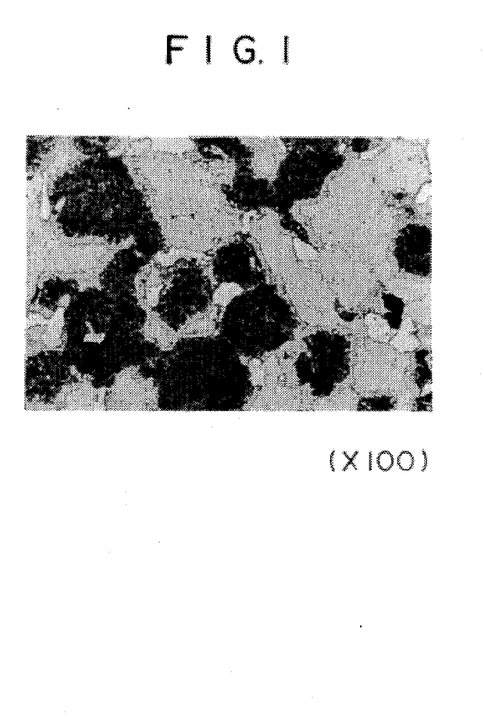
FIG. 1 is a photograph of metal microstructure showing one example of the structure of the target material of the present invention.
Figure 2:
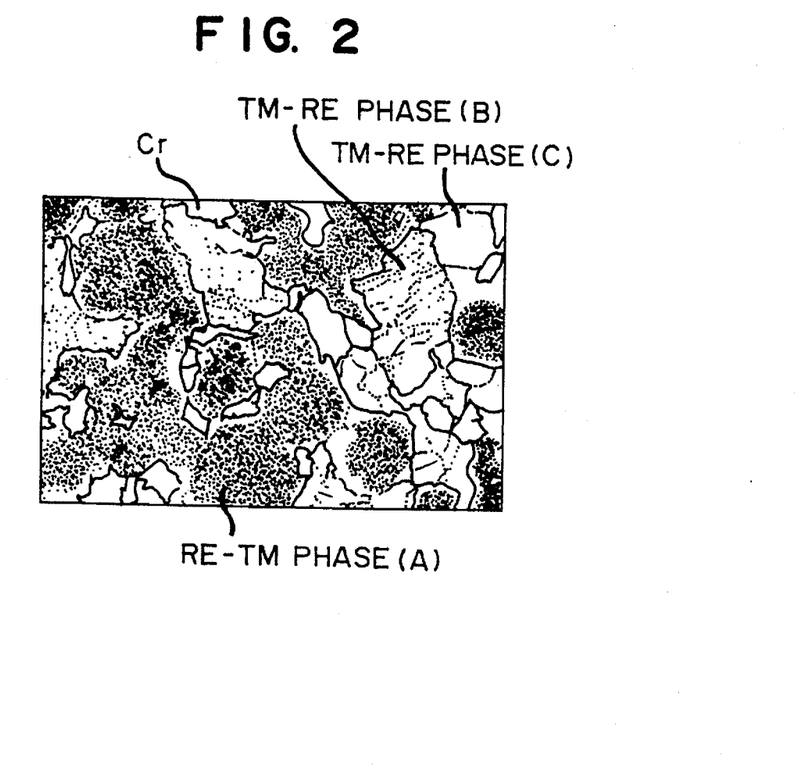
FIG. 2 is a sketch showing the example of structure of the target material of the present invention.

FIG. 1 shows a photograph of the metal micro-structure of target sample No. 21. FIG. 2 shows an sketch of FIG. 1.

As shown in FIG. 1, target sample No. 21 of the present invention has a structure formed by sintering of the starting powders without destruction of their structures. In FIG. 1, the black spot in the white phase is RE-TM phase derived from Tb—Fe eutectic alloy powder and has a rapidly cooled eutectic structure in which substantially, αTb and $Fe_2Tb$ are finely dispersed.

In FIG. 1, the white grain is a phase of Fe—10Tb, Fe, Co or Cr and could not be specified by only the photograph of the microstructure. But, it could be specified using an X-ray microanalyzer.

It was confirmed that a very thin intermetallic compound layer had been formed by sintering in the boundary surface between a phase composed mainly of the metal of the iron group and the phase composed of the eutectic alloy.

EXAMPLE 3

The target materials listed in Table 5 were produced by mixing powders prepared by the same gas atomization process as in Example 1, i.e., powder (a) for forming an RE-TM phase (A), powder (b) for forming a TM-RE phase (B), powder (c') for forming an alloy phase (C') of Co and an element selected from Cr, Ti, V, Nb and Ta, i.e., typical elements in groups 4A, 5A and 6A, and each alloy powder of Fe and the selected element which is shown in Table 5.

Sample No. 22 shown in Table 5 was obtained by adding Cr to Co necessary for a desired composition in an amount of 25% at which the resulting Co—Cr alloy was nonmagnetic, and alloying the surplus Cr in the whole composition with Fe.

In Sample No. 23, Cr was present as an alloy with Fe.

It can be seen that sample No. 22 of the present invention obtained by alloying Cr with Co positively can have a maximum magnetic permeability and a saturation magnetic flux density which are both lower than those of sample No. 23 in which Cr is present as an alloy with Fe.

In the target materials obtained by making present Ti, V, Nb or Tb, respectively, as an alloy with Co which are listed in Table 5, the alloying with Co was effective in reducing the magnetic permeability.

Figure 3:
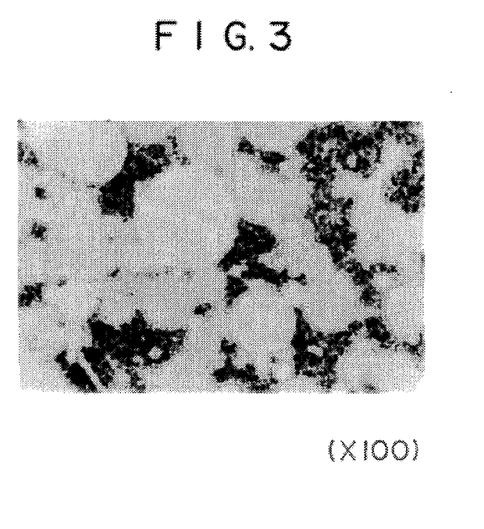
FIG. 3 is a photograph of a metal microstructure showing another example of the structure of the target material of the present invention.
Figure 4:
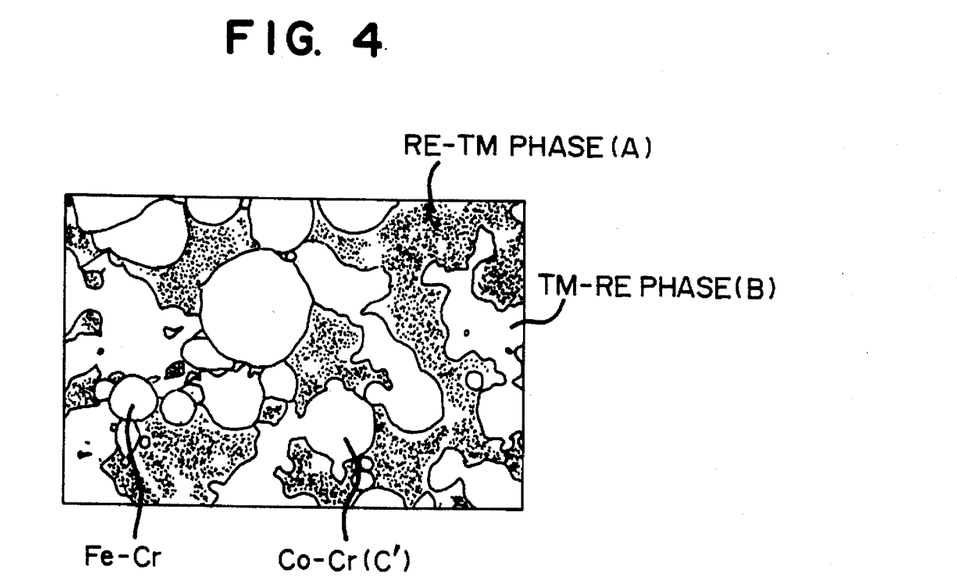
FIG. 4 is a sketch showing the other example of structure of the target material of the present invention.

FIG. 3 shows a photograph of the metal micro-structure of target sample No. 22. FIG. 4 shows a sketch of FIG. 3.

As shown in FIG. 3, target sample No. 22 of the present invention has a structure formed by sintering of the starting powders without destruction of their structures, like target sample No. 21 of the present invention described in Example 2. The black phase in FIG. 3 is an RE-TM phase derived from Tb—Fe eutectic alloy powder and has a rapidly cooled eutectic structure in which substantially, αTb and $Fe_2Tb$ are finely dispersed.

In FIG. 3, the white grain is a phase of Fe—10Tb, Fe—Cr or Co—Cr and could not be specified by only the photograph of the microstructure. But, it could be specified using an X-ray microanalyzer.

EXAMPLE 4

After evacuation to $4 \times 10^{-4}$ Pa, a film was formed using each of samples No. 1 to No. 3, i.e., the target materials of the present invention produced in Example 1, at an argon pressure of $7 \times 10^{-1}$ Pa and a radio frequency (RF) power of 200 W, and the component distribution in the film was investigated.

In this case, the distance between the target and a glass substrate was adjusted to 70 mm and the composition on the glass substrate was measured by means of EPMA at 20-mm intervals outward in the direction of the radius from the center of φ125 mm×3 mm target by placing the target and the glass substrate face to face in a stationary state.

Figure 5A:
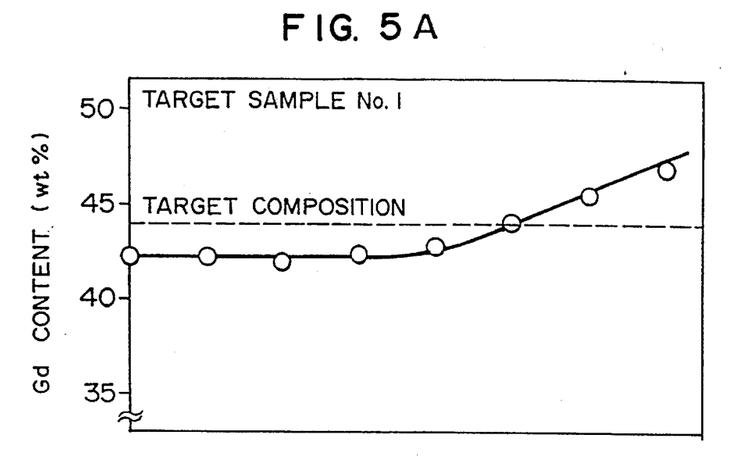
FIGS. 5(a)–(c) are graphs showing examples of component distribution in a film formed by using each of the target materials of the present invention.
Figure 5B:
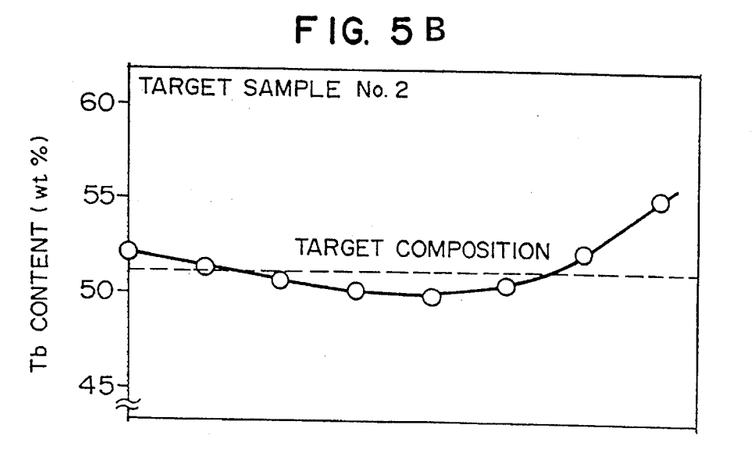
Figure 5C:
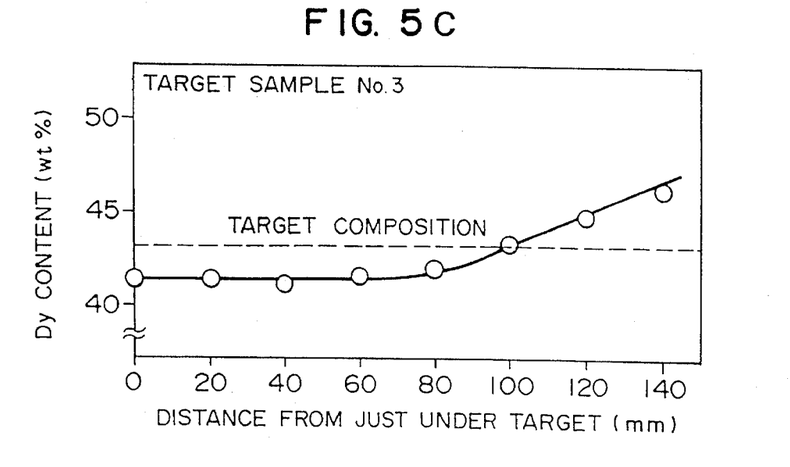

The results obtained are shown in FIG. 5.

As shown in FIGS. 5(a)–(c), in the films obtained from the target materials of the present invention, the change of the component distribution can be kept less than 2% in a wide range of from a position just under the center of the target to 100 mm. The reason can be presumed as follows: the difference in angle of emission between a rare earth element and an intermetallic compound at the time of sputtering is reduced by an RE-TM phase (A) having an eutectic structure.

Comparative Example 2

Targets corresponding to the target materials disclosed in Japanese Patent Laid-Open No. 4-365860 were produced as targets of comparative example. First, the starting powders shown in Table 6 were prepared by the same gas atomization process as in Example 1 so as to give the same compositions of target as those of samples No. 1 to No. 3, respectively. The starting powders were blended so as to give each composition shown in Table 6, and then held at a temperature of 600° C. and a pressure of 11.8 MPa for 1 hour to be sintered. The sintered product was held at $4 \times 10^{-4}$ Pa and 660° C. for 4 hours to obtain a target material. The magnetic characteristics of the target materials of comparative example thus obtained were measured in the same manner as in Example 1. The results obtained are shown in Table 5.

When the target materials of the same compositions listed in Table 1 and Table 6, respectively, for example, sample No. 1 listed in Table 1 and sample No. 28 listed in Table 6 are compared, they are substantially equal to each other in magnetic permeability but sample No. 28 is inferior to sample No. 1 in the component distribution in a film as described below.

Next, a film was formed by the use of each of the target materials of comparative example in the same manner as in Example 3. The component distributions in the films thus obtained are shown in FIG. 6.

Figure 6A:
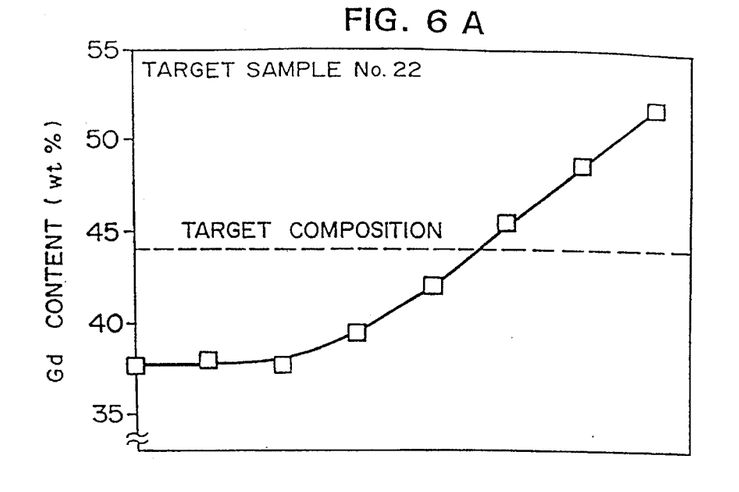
FIGS. 6(a)–(c) are graphs showing examples of component distribution in a film formed by using each of target materials of comparative example.
Figure 6B:
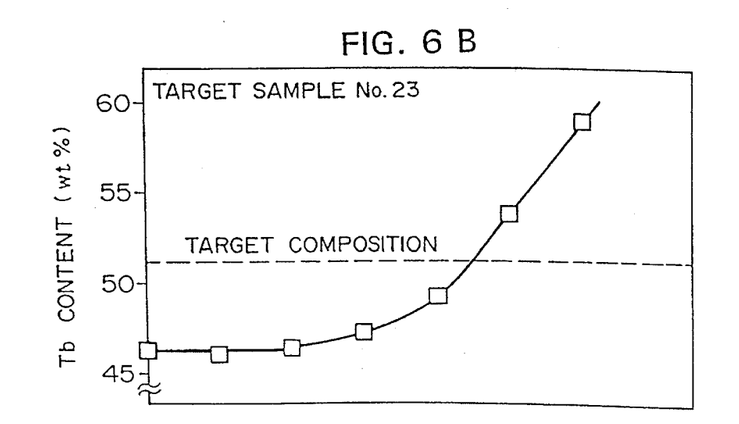
Figure 6C:
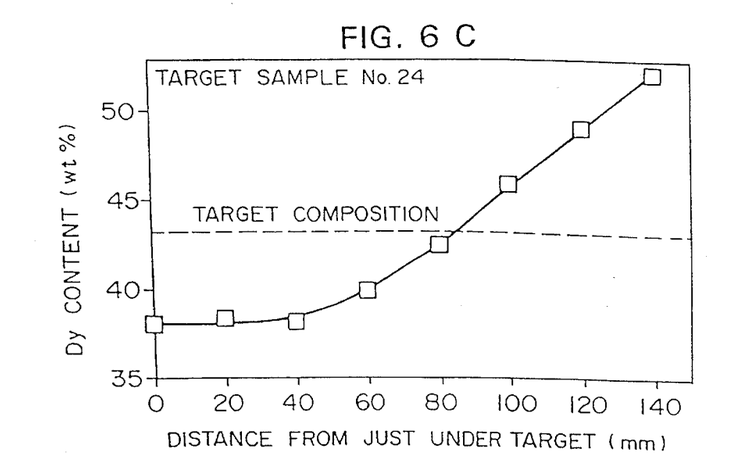

As shown in FIGS. 6(a)–(c), in the films formed by the use of the target materials of comparative example, the content of a rare earth element tends to increase markedly from a position about 60 mm apart from a position just under the center of the target.

The reason for such component distributions can be presumed as follows. In the comparative example, an intermetallic compound was almost formed by additional heat treatment process, so that the variation of the component distributions was remarkable.

As described above, the target material of the present invention is suitable for magnetron sputtering because of its low magnetic permeability, can have a very high use efficiency as a target containing an expensive rare earth element(s), and is very advantageous for reducing the production cost of a magneto-optical recording medium. According to the present invention, the component distribution in a film is uniform and hence the present invention is very effective in assuring the reliability in the production of a magneto-optical recording medium whose magnetic characteristics change very sensitively with the content of a rare earth element.

Furthermore, in the present invention, the RE-TM phase (A) and the TM-RE phase (B) are sintered, so that the brittleness, a problem caused by the presence of the TM-RE phase (B), can be reduced. When one or more Cr type corrosion-resistant elements X are incorporated into the target material of the present invention, the corrosion resistance of a film can be further improved. The presence of an alloy phase of Co and at least one element selected from the elements in group 4A, 5A and 6A further reduces the magnetic permeability advantageously.

The present invention is advantageous also in that since powders composed of a rare earth element(s) and the RE-TM phase (A) or the TM-RE phase (B) are used, the oxygen content of the target material can be reduced as compared with that of a target material obtained by using active pure RE powder as it is.

TABLE 1

| No. | Composition of target material (%) | Blending ratio of starting powders (wt %) | | | | Structure (% by area) | | | Bs (T) | μ max |
|---|---|---|---|---|---|---|---|---|---|---|
| 1 | 44.1Gd-48.4Fe-7.5Co (22Gd-68Fe-10Co at %) | (a) | 80Gd—Fe | 46.9 | (A) | Gd—Fe Eutectic | 42.80 | | 0.61 | 7 |
| | | (b) | Fe-15Gd | 44.0 | (B) | Fe-15Gd | 41.1 | | | |
| | | (c) | Fe | 1.6 | (C) | Fe | 4.4 | 16.0 | | |
| | | | Co | 7.5 | | Co | 11.6 | 16.0 | | |
| 2 | 51.0Tb-39.9Fe-9.1Co (27Tb-60Fe-13Co at %) | (a) | 80Tb—Fe | 51.8 | (A) | Tb—Fe Eutectic | 44.5 | | 0.52 | 6 |
| | | (b) | Fe-24Tb | 35.7 | (B) | Fe-24Tb | 35.4 | | | |
| | | | Co-10Tb | 2.4 | | Co-10Tb | 14.2 | | | |
| | | (c) | Fe | 10.1 | (C) | Fe | 5.9 | | | |
| 3 | 43.2Dy-37.4Fe-19.4Co (21Dy-53Fe-26Co at %) | (a) | 85.5Dy—Fe | 40.6 | (A) | Dy—Fe Eutectic | 36.2 | | 0.63 | 7 |
| | | (b) | Fe-13Dy | 34.6 | (B) | Fe-13Dy | 33.8 | 59.7 | | |
| | | | Co-17Dy | 23.3 | | Co-17Dy | 25.9 | | | |
| | | (c) | Fe | 1.5 | (C) | Fe | 4.1 | | | |
| 4 | 38.4Dy-11.3Tb-23.1Fe-27.2Co (20Dy-6Tb-35Fe-39Co at %) | (a) | 88Dy-Fe | 35.9 | (A) | Dy—Fe Eutectic | 32.4 | 50.0 | 0.47 | 4 |
| | | | 70Tb—Fe | 13.8 | | Tb—Fe Eutectic | 17.6 | | | |

TABLE 1-continued

| No. | Composition of target material (%) | | Blending ratio of starting powders (wt %) | | | Structure (% by area) | | | Bs (T) | μ max |
|---|---|---|---|---|---|---|---|---|---|---|
| | | (b) | Fe-10Tb | 16.3 | (B) | Fe-10Tb | 19.6 | 50.0 | | |
| | | | Co-20Dy | 34.0 | | Co-20Dy | 30.4 | | | |
| 5 | 46.6Dy-3.4Nd-40.1Fe-9.9Co | (a) | 80Dy—Fe | 49.3 | (A) | Dy—Fe Eutectic | 39.8 | 48.3 | 0.57 | 7 |
| | (24Dy-2Nd-60Fe-14Co) | | 85Nd—Fe | 4.1 | | Nd—Fe Eutectic | 8.5 | | | |
| | | (b) | Fe-17Dy | 33.5 | (B) | Fe-17Dy | 31.7 | 47.1 | | |
| | | | Co-13Dy | 11.3 | | Co-13Dy | 15.4 | | | |
| | | (c) | Fe | 1.8 | (C) | Fe | 4.6 | | | |

TABLE 2

| No. | Composition of target material (%) | | Blending ratio of starting powders (wt %) | | | Structure (% by area) | | | Bs (T) | μ max |
|---|---|---|---|---|---|---|---|---|---|---|
| 6 | 25.4Gd-24.6Dy-42.9Fe-7.1Co | (a) | 67Gd—Fe | 30.0 | (A) | Gd—Fe Eutectic | 29.7 | 62.8 | 0.52 | 6 |
| | (13Gd-13Dy-64Fe-10Co at %) | | 66Dy—Fe | 37.3 | | Dy—Fe Eutectic | 33.1 | | | |
| | | (b) | Fe-23Gd | 25.6 | (B) | Fe-23Gd | 26.7 | | | |
| | | (c) | Co | 7.1 | (C) | Co | 10.5 | | | |
| 7 | 39.1Ho-48.5Fe-12.4Co | (a) | 77Ho—Fe | 42.7 | (A) | Ho—Fe Eutectic | 39.6 | | 0.74 | 9 |
| | (18Ho-66Fe-16Co at %) | (b) | Fe-12Ho | 43.8 | (B) | Fe-12Ho | 42.4 | 60.4 | | |
| | | | Co-8Ho | 13.5 | | Co-8Ho | 18.0 | | | |
| 8 | 49.8Er-43.2Fe-7.0Co | (a) | 80Er—Fe | 57.9 | (A) | Er—Fe Eutectic | 48.5 | | 0.67 | 8 |
| | (25Er-65Fe-10Co at %) | (b) | Fe-10Er | 34.2 | (B) | Fe-10Er | 36.6 | | | |
| | | (c) | Fe | 0.9 | (C) | Fe | 3.2 | 14.9 | | |
| | | | Co | 7.0 | | Co | 11.7 | | | |
| 9 | 48.3Gd-48.1Fe-3.6Ni | (a) | 93.6Gd—Fe | 48.5 | (A) | Gd—Fe Eutectic | 46.2 | | 0.70 | 8 |
| | (25Gd-70Fe-5Ni at %) | (b) | Fe-5Gd | 47.4 | (B) | Fe-5Gd | 45.5 | 53.8 | | |
| | | | Ni-12.4Gd | 4.1 | | Ni-12.4Gd | 8.3 | | | |
| 10 | 28.2Dy-23.9Tb-24Fe-23.9Co | (a) | 70Dy—Fe | 36.5 | (A) | Dy—Fe Eutectic | 33.6 | 62.9 | 0.61 | 7 |
| | (15Dy-13Tb-37Fe-35Co at %) | | 70Tb—Fe | 29.2 | | Tb—Fe Eutectic | 29.3 | | | |
| | | (b) | Co-19Dy | 29.1 | (B) | Co-19Dy | 27.8 | | | |
| | | (c) | 75Fe-Co | 5.2 | (C) | 75-Fe-Co | 9.3 | | | |

TABLE 3

| No. | Composition of target material (%) | | Blending ratio of starting powders (wt %) | | | Structure (% by area) | | | Bs (T) | μ max |
|---|---|---|---|---|---|---|---|---|---|---|
| 11 | 44.1Gd-48.4Fe-7.5Co | (a) | 80Gd—Fe | 55.1 | (A) | Gd—Fe Eutectic | 49.6 | | 0.86 | 14 |
| | (22Gd-68Fe-10Co at %) | (c) | Fe | 37.4 | (C) | Fe | 38.3 | 50.4 | | |
| | | | Co | 7.5 | | Co | 12.1 | | | |
| 12 | 51.0Tb-39.9Fe-9.1Co | (a) | 80Tb—Fe | 63.8 | (A) | Tb—Fe Eutectic | 54.4 | | 0.77 | 11 |
| | (27Tb-60Fe-13Co at %) | (c) | Fe | 27.1 | (C) | Fe | 31.6 | 45.6 | | |
| | | | Co | 9.1 | | Co | 14.0 | | | |
| 13 | 43.2Dy-37.4Fe-19.4Co | (a) | 85.5Dy—Fe | 50.5 | (A) | Dy—Fe Eutectic | 44.5 | | 0.87 | 16 |
| | (21Dy-53Fe-26Co at %) | (c) | Fe | 30.1 | (C) | Fe | 32.9 | 55.9 | | |
| | | | Co | 19.4 | | Co | 22.6 | | | |

TABLE 4

| No. | Composition of target material (%) | | Blending ratio of starting powders (wt %) | | | Structure (% by area) | | | Bs (T) | μmax |
|---|---|---|---|---|---|---|---|---|---|---|
| 14 | 46.7Tb—42.3Fe—8.7Co—2.3Nb | (a) | 85Tb—Fe | 49.6 | (A) | Tb—Fe Eutectic | 40.1 | | 0.67 | 8 |
| | (24Tb—62Fe—12Co—2Nb at %) | (b) | Fe—10Tb | 26.4 | (B) | Fe—10Tb | 27.0 | 40.8 | | |

TABLE 4-continued

| No. | Composition of target material (%) | | Blending ratio of starting powders (wt %) | | | Structure (% by area) | | Bs (T) | μmax |
|---|---|---|---|---|---|---|---|---|---|
| | | (c) | Co—18Tb | 10.6 | (C) | Co—18Tb | 13.8 | | |
| | | | Fe | 0.8 | | Fe | 2.7  19.1 | | |
| | | | Fe—18Nb | 12.6 | | Fe—18Nb | 16.4 | | |
| 15 | 45.9Tb—46.3Fe—5.2Co—2.6Cr | (a) | 80Tb—Fe | 48.9 | (A) | Tb—Fe Eutectic | 41.9 | 0.60 | 8 |
| | (23Tb—66Fe—7Co—4Cr at %) | (b) | Fe—15Tb | 41.0 | (B) | Fe—15Tb | 37.9  47.4 | | |
| | | | Co—10Tb | 5.8 | | Co—10Tb | 9.5 | | |
| | | (c) | Fe | 1.7 | (C) | Fe | 4.4 | | |
| | | x | Cr | 2.6 | X | Cr | 6.3 | | |
| 16 | 49.6Tb—38.0Fe—8.2Co—4.2Ta | (a) | 7.46Tb—Fe | 49.3 | (A) | Tb—Fe Eutectic | 37.9 | 0.38 | 5 |
| | (27Tb—59Fe—12Co—2Ta at %) | (b) | Fe—42Tb | 48.3 | (B) | Fe—42Tb | 44.2 | | |
| | | (c) | Co | 8.2 | (C) | Co | 12.6 | | |
| | | x | Ta | 4.2 | X | Ta | 5.3 | | |
| 17 | 41.1Dy—52.0Fe—5.5Co—1.4Al | (a) | 66Dy—Fe | 55.2 | (A) | Dy—Fe Eutectic | 44.5 | 0.69 | 8 |
| | (19Dy—70Fe—7Co—4Al at %) | (b) | Fe—14Dy | 29.4 | (B) | Fe—14Dy | 30.5  41.7 | | |
| | | | Co—10Dy | 6.1 | | Co—10Dy | 11.2 | | |
| | | (c) | Fe—15Al | 9.3 | X | Fe—15Al | 13.8 | | |
| 18 | 48.7Gd—48.3Fe—3.0Ti | (a) | 82Gd—Fe | 54.5 | (A) | Gd—Fe Eutectic | 46.8 | 0.40 | 5 |
| | (25Gd—70Fe—5Ti at %) | (b) | Fe—15Gd | 27.9 | (B) | Fe—15Gd | 33.2 | | |
| | | (c) | Fe—17Ti | 17.6 | (C) | Fe—17Ti | 20.0 | | |
| 19 | 40.0Ho—48.8Fe—6.3Co—4.0Ta | (a) | 88.6Ho—Fe | 33.4 | (A) | Ho—Fe Eutectic | 33.4 | 0.56 | 7 |
| | (18Ho—65Fe—8Co—2Ta at %) | (b) | Fe—18Ho | 54.9 | (B) | Fe—18Ho | 49.1  60.4 | | |
| | | | Co—8Ho | 6.8 | | Co—8Ho | 11.3 | | |
| | | x | Ta | 4.9 | X | Ta | 6.2 | | |
| 20 | 42.9Er—50.0Fe—3.8Ni—3.3Cr | (a) | 87Er—Fe | 38.2 | (A) | Er—Fe Eutectic | 35.3 | 0.56 | 7 |
| | (20Er—70Fe—5Ni—5Cr at %) | (b) | Fe—15Er | 52.9 | (B) | Fe—15Er | 46.9  56.7 | | |
| | | | Ni—32Er | 5.6 | | Ni—32Er | 9.8 | | |
| | | x | Cr | 3.3 | X | Cr | 8.0 | | |
| 21 | 41.6Tb—47.4Fe—6.2Co—4.8Cr | (a) | 87Tb—Fe | 42.6 | A | Tb—Fe Eutectic | 37.6 | 0.68 | 8 |
| | | (b) | Fe—10Rb | 45.8 | B | Fe—10Tb | 40.5 | | |
| | | (c) | Fe | 0.6 | C | Fe | 2.4  12.3 | | |
| | | | Co | 6.2 | | Co | 9.9 | | |
| | | x | Cr | 4.8 | X | Cr | 9.6 | | |

TABLE 5

| No. | Composition of target material (%) | | Blending ratio of starting powders (wt %) | | | Structure (% by area) | | (T) | μ max |
|---|---|---|---|---|---|---|---|---|---|
| 22 | 41.6Tb—47.4Fe—6.2Co—4.8Cr | (a) | 87Tb—Fe | 43.6 | (A) | Tb—Fe Eutectic | 36.5 | 0.66 | 7 |
| | (20Tb—65Fe—8Co—7Cr at %) | (b) | Fe—10Tb | 36.7 | (B) | Fe—10Tb | 33.5 | | |
| | | (c) | Co—23Cr | 8.0 | (C) | Co—23Cr | 12.2  27.5 | | |
| | | | Fe—25Cr | 11.7 | | Fe—25Cr | 15.3 | | |
| 23 | 41.6Tb—47.4Fe—6.2Co—4.8Cr | (a) | 87Tb—Fe | 43.6 | (A) | Tb—Fe Eutectic | 39.9 | 0.72 | 10 |
| | (20Tb—65Fe—8Co—7Cr at %) | (b) | Fe—10Tb | 36.7 | (B) | Fe—10Tb | 33.1 | | |
| | | (c) | Co | 6.2 | (C) | Co | 9.4  27.0 | | |
| | | | Fe—35Cr | 13.5 | | Fe—35Cr | 17.6 | | |
| 24 | 41.7Tb—47.7Fe—6.2Co—4.4Ti | (a) | 87Tb—Fe | 44.1 | (A) | Tb—Fe Eutectic | 34.1 | 0.69 | 8 |
| | (20Tb—65Fe—8Co—7Ti at %) | (b) | Fe—10Tb | 33.8 | (B) | Fe—10Tb | 37.2 | | |
| | | (c) | Co—29Ti | 8.7 | (c) | Co—29Ti | 12.0  28.7 | | |
| | | | Fe—14Ti | 13.4 | | Fe—14Ti | 16.7 | | |
| 25 | 41.6Tb—47.5Fe—6.2Co—4.7V | (a) | 80Tb—Fe | 46.1 | (A) | Tb—Fe Eutectic | 35.0 | 0.61 | 5 |
| | (20Tb—65Fe—8Co—7V at %) | (b) | Fe—13Tb | 36.5 | (B) | Fe—13Tb | 40.8 | | |
| | | (c) | Co—23V | 8.0 | (c) | Co—23V | 12.9  24.2 | | |
| | | | Fe—30V | 9.4 | | Fe—30V | 11.3 | | |
| 26 | 40.1Tb—45.8Fe—5.9Co—8.2Nb | (a) | 87Tb—Fe | 43.5 | (A) | Tb—Fe Eutectic | 34.8 | 0.57 | 5 |
| | (20Tb—65Fe—8Co—7Nb at %) | (b) | Fe—10Tb | 22.3 | (B) | Fe—10Tb | 30.1 | | |
| | | (c) | Co—39Nb | 9.7 | (c) | Co—39Nb | 11.2  35.1 | | |
| | | | Fe—18Nb | 24.5 | | Fe—18Nb | 23.9 | | |
| 27 | 37.2Tb—42.5Fe—5.5Co—14.8Ta | (a) | 66Tb—Fe | 45.7 | (A) | Tb—Fe Eutectic | 42.5 | 0.53 | 4 |

TABLE 5-continued

| No. | Composition of target material (%) | Blending ratio of starting powders (wt %) | | | Structure (% by area) | | | (T) | μ max |
|---|---|---|---|---|---|---|---|---|---|
| | (20Tb—65Fe—8Co—7Ta at %) | (b) | Fe—5Tb | 6.3 | (B) | Fe—5Tb | 11.8 | | |
| | | (c) | Co—56Ta | 12.5 | (C) | Co—56Ta | 13.7  45.7 | | |
| | | | Fe—22Ta | 35.5 | | Fe—22Ta | 32.0 | | |

TABLE 6

| No. | Composition of target material (%) | Blending ratio of starting powders (wt %) | | | Structure (% by area) | | | Bs (T) | μmax |
|---|---|---|---|---|---|---|---|---|---|
| 28 | 44.1Gd—48.4Fe—7.5Co (22Gd—68Fe—10Co at %) | RE (b) | Gd Fe—15Gd Co—10Gd — | 34.7 57.0 8.3 — | RE (B) — | Gd Fe—15Gd Co—10Gd Reaction phase | 19.7 35.3  40.4 5.1 39.9 | 0.67 | 8 |
| 29 | 51.0Tb—39.9Fe—9.1Co (27Tb—60Fe—13Co at %) | RE (b) | Tb Fe—24Tb Co—10Tb — | 37.5 52.4 10.1 — | RE (B) — | Tb Fe—24Tb Co—10Tb Reaction phase | 27.8 42.9  50.7 7.8 21.5 | 0.57 | 8 |
| 30 | 43.2Dy—37.4Fe—19.4Co (21Dy—53Fe—26Co at %) | Re (b) | Dy Fe—13Dy Co—17Dy — | 33.6 43.0 23.4 — | RE (B) — | Dy Fe—13Dy Co—17Dy Reaction phase | 19.1 33.7  52.4 18.7 28.5 | 0.69 | 9 |

What is claimed is:

1. A target material for magneto-optical recording medium comprising an RE-TM phase and a TM-RE phase bonded to each other, wherein said RE-TM phase (A) having a composition with an RE content higher than that of the composition of an intermetallic compound represented by the chemical formula $TM_2RE$, and said TM-RE phase (B) having a composition with an RE content equal to or lower than that of the composition of an intermetallic compound represented by the chemical formula $TM_2RE$, wherein RE denotes at least one rare earth element selected from the group of elements consisting of Nd, Gd, Tb, Dy, Ho and Er, and TM denotes at least one element selected from the group consisting of Fe, Co and Ni.

2. The target material for magneto-optical recording medium according to claim 1, wherein the RE-TM phase (A) is an eutectic alloy phase of RE and Fe which has an RE content of 66 wt % or more.

3. The target material for magneto-optical recording medium according to claim 1, wherein the TM-RE phase (B) has a composition with an RE content lower than that of the composition of an intermetallic compound represented by the chemical formula $TM_{17}RE_2$.

4. The target material for magneto-optical recording medium according to claim 1, wherein at least one metal element X selected from the group consisting of Al, Ti, Cu, Cr, Nb, Ta, Pd and Pt is present in an amount of 10 wt % or less.

5. The target material for magneto-optical recording medium according to claim 1, which has a maximum relative magnetic permeability of 10 or less.

6. The target material for magneto-optical recording medium according to claim 1, which has a saturation magnetic flux density (Bs) of 0.8 T or less.

7. The target material for magneto-optical recording medium according to claim 1, which has a structure wherein RE and an intermetallic compound of RE and TM are dispersed in the RE-TM phase (A).

8. A target material for magneto-optical recording medium comprising an RE-TM phase and a TM-RE phase bonded to each other, wherein said RE-TM phase (A) having a composition with an RE content higher than that of the composition of an intermetallic compound represented by the chemical formula $TM_2RE$, said TM-RE phase (B) having a composition with an RE content equal to or lower than that of the composition of an intermetallic compound represented by the chemical formula $TM_2RE$, and a TM phase (C) composed of a TM element or an alloy of TM elements, wherein RE denotes at least one rare earth element selected from the group consisting of Nd, Gd, Tb, Dy, Ho and Er, and TM denotes at least one element selected from the group consisting of Fe, Co and Ni.

9. The target material for magneto-optical recording medium according to claim 8, wherein the RE-TM phase (A) is an eutectic alloy phase of RE and Fe which has an RE content of 66 wt % or more.

10. The target material for magneto-optical recording medium according to claim 8, wherein the TM-RE phase (B) has a composition with an RE content lower than that of the composition of an intermetallic compound represented by the chemical formula $TM_{17}RE_2$.

11. The target material for magneto-optical recording medium according to claim 8, wherein at least one metal element X selected from the group consisting of Al, Ti, Cu, Cr, Nb, Ta, Pd and Pt is present in an amount of 10 wt % or less.

12. The target material for magneto-optical recording medium according to claim 8, wherein a TM element is used for phase (C) and a Co alloy phase, composed of 50% by atom or less of at least one element selected from the elements in groups 4A, 5A and 6A and substantially the balance composed of Co, is present at least as a part of the TM phase (C).

13. The target material for magneto-optical recording medium according to claim 8, wherein a TM element is used for phase (C) and a Co alloy phase, composed of 30% by atom or less of CR or V and substantially the balance composed of Co, is present at least as a part of the TM phase (C).

14. The target material for magneto-optical recording medium according to claim 8, which has a maximum relative magnetic permeability of 10 or less.

15. The target material for magneto-optical recording medium according to claim 8, which has a saturation magnetic flux density (Bs) 0.8 T or less.

16. The target material for magneto-optical recording medium according to claim 8, which has a structure wherein RE and an intermetallic compound of RE and TM are dispersed in the RE-TM phase (A).

17. A process for producing a target material for magneto-optical recording medium which comprises sintering, under pressure, powder (a) having a composition with an RE content higher than that of the composition of an intermetallic compound represented by the chemical formula $TM_2RE$, and a structure in which RE and an intermetallic compound of RE and TM are dispersed, and powder (b) having a composition with an RE content equal to or lower than that of the composition of an inter-metallic compound represented by the chemical formula $TM_2RE$, wherein RE denotes at least one rare earth element selected from the group of elements consisting of Nd, Gd, Tb, Dy, Ho and Er, and TM denotes at least one element selected from the group consisting of Fe, Co and Ni.

18. The process according to claim 17, wherein the powder (a), the powder (b), and a powder (c) of a TM element or an alloy of TM elements are mixed and then sintered under pressure.

19. The process according to claim 17, wherein at least one metal element X selected from the group consisting of Al, Ti, Cu, Cr, Nb, Ta, Pd and Pt is added in an amount of 10 wt % or less in the form of elemental powder or powder of an alloy with at least one of rare earth element and a metal of the group consisting of Fe, Co and Ni.

20. The process according to claim 18, wherein a TM element is used for powder (c) and a Co alloy powder, composed of 50% or less of at least one element selected from the elements in group 4A, 5A and 6A and substantially the balance composed of Co, is used in place of a part or the whole of the TM element powder (c).

21. A target material for magneto-optical recording medium consisting essentially of RE-TM phase (A) having a composition with an RE content higher than that of the composition of an intermetallic compound represented by the chemical formula $TM_2RE$, and said TM-RE phase (B) having a composition with an RE content equal to or lower than that of the composition of an intermetallic compound represented by the chemical formula $TM_2RE$, wherein RE denotes at least one rare earth element selected from the group of elements consisting of Nd, Gd, Tb, Dy, Ho and Er, and TM denotes at least one element selected from the group consisting of Fe, Co and Ni.

22. A target material for magneto-optical recording medium consisting essentially of an RE-TM phase (A) having a composition with an RE content higher than that of the composition of an intermetallic compound represented by the chemical formula $TM_2RE$, a TM-RE phase (B) having a composition with an RE content equal to or lower than that of the composition of an intermetallic compound represented by the chemical formula $TM_2RE$, and a TM phase (C) composed of a TM element or an alloy of TM elements, wherein RE denotes at least one rare earth element selected from the group of elements consisting of Nd, Gd, Tb, Dy, Ho and Er, and TM denotes at least one element selected from the group consisting of Fe, Co and Ni.

* * * * *